United States Patent [19]

Reilly, Jr.

[11] Patent Number: 4,507,497
[45] Date of Patent: Mar. 26, 1985

[54] WATER SOLUBLE MICHLERS KETONE ANALOGS

[75] Inventor: Laurence W. Reilly, Jr., Yorktown Heights, N.Y.

[73] Assignee: Minnesota Mining and Manufacturing Company, St. Paul, Minn.

[21] Appl. No.: 471,838

[22] Filed: Mar. 3, 1983

[51] Int. Cl.$^3$ ............................................. C07C 101/453
[52] U.S. Cl. ................................... 562/441; 562/459; 204/159.23; 260/501.15; 560/43; 560/44
[58] Field of Search .................. 562/441, 459; 564/328

[56] References Cited

U.S. PATENT DOCUMENTS

| | | | |
|---|---|---|---|
| 3,529,982 | 9/1970 | Luethi et al. | 562/457 |
| 3,728,377 | 4/1973 | Kelly et al. | 204/159.23 |
| 3,828,071 | 8/1974 | Kast et al. | 564/328 |
| 3,988,228 | 10/1976 | Newland et al. | 204/159.23 |
| 4,147,552 | 4/1979 | Specht et al. | 96/115 R |
| 4,147,604 | 4/1979 | Kuesters et al. | 260/859 |
| 4,156,012 | 5/1979 | Hall et al. | 562/441 |
| 4,374,984 | 2/1983 | Eichler et al. | 564/328 |

FOREIGN PATENT DOCUMENTS 22188 1/1981 European Pat. Off. ........ 204/159.23

OTHER PUBLICATIONS

Nov. 1980, Research disclosure pp. 518–521, #19947.
Feb. 1981, Research disclosure, p. 93, #20221.

*Primary Examiner*—James H. Reamer
*Attorney, Agent, or Firm*—Donald M. Sell; James A. Smith; Lorraine R. Sherman

[57] ABSTRACT

Michler's ketone analogs and salts thereof, which are photosensitizers in water-soluble photoinitiator systems used to induce polymerization in free-radically-curable, ethylenically-unsaturated materials, are disclosed. The Michler's ketone analogs have the formula:

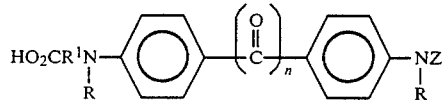

wherein
each R is an alkyl group of 1 to 8 carbon atoms,
$R^1$ is an alkylene group having 1 to 8 carbon atoms,
Z is $R^1COOH$ or $R^1H$, and
n is an integer having a value of 1 or 2.

The photoinitiator systems are useful in imaging systems.

6 Claims, No Drawings

WATER SOLUBLE MICHLERS KETONE ANALOGS

TECHNICAL FIELD

This invention relates to a water-soluble photoinitiator system used to induce polymerization in free-radically-curable, ethylenically-unsaturated materials. In another aspect it relates to novel Michler's ketone analogs and salts thereof, which are photosensitizers in the water-soluble photoinitiator system. Photoinitiator systems are useful in imaging systems such as photopolymerizable lithographic plate constructions, in proofing materials, and in radiation (UV) cured coatings and inks.

BACKGROUND ART

Photoinitiator systems, sometimes known as mixed photoinitiators or co-initiators, have been disclosed for use with polymerizable monomers. It is generally accepted that an initiator compound forms free radicals by interacting with a photosensitizer compound which is capable of absorbing radiation of specific wavelengths. The free radicals formed then initiate polymerization of ethylenically-unsaturated materials that are present in a composition with the photoinitiator system.

Many oil-soluble photoinitiator systems are known in the art. A well-known oil-soluble photoinitiator system is Michler's ketone,

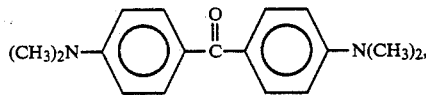

in combination with benzophenone or iodonium salts, a system known to induce high speed photopolymerization. This system cannot be used in water-based coatings due to the insolubility of Michler's ketone in water. U.S. Pat. No. 4,147,604 relates to diaminobenzophenone compounds (none of which have acid or ester functionality) which are useful in photopolymerizable binders and have improved solubility in organic solvents.

Other non-water soluble photoinitiator systems are disclosed in European Patent Application No. 80103303.6 and U.S. Pat. No. 4,147,552, wherein 3-keto-substituted coumarin compounds useful as sensitizers are taught. Also, photosensitizers are disclosed in U.S. Pat. No. 3,728,377 (4,4-bis(alkoxycarbonyl)benzoin ethers) and U.S. Pat. No. 3,988,228 (halogen containing aromatic ketones) and November 1980 RESEARCH DISCLOSURE 19947 (simple bis-quinones).

Very few water-soluble photoinitiator systems which absorb in the UV or near-UV portion of the spectrum (i.e. 320–420 nm) are known. One such system comprising water-soluble derivatives of benzophenone and benzil is disclosed in February 1981 RESEARCH DISCLOSURE 20221. There is need in the art for a high-speed, water-soluble photoinitiator system which is capable of inducing efficient curing of ethylenically-unsaturated compounds for use in water-based lithographic plate technology.

DISCLOSURE OF INVENTION

The present invention provides a photoinitiator system for the photopolymerization of an addition-polymerizable compound or mixture of such compounds containing ethylenic unsaturation, the system comprising a photosensitizer compound capable of absorbing radiation in the range of 320–420 nm, the compound being a salt of a compound having the formula

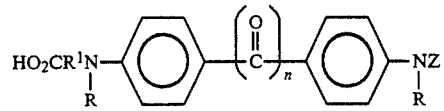

I and hereinafter referred to as a Michler's ketone analog (hereinafter sometimes referred to as MKA)
wherein
each R is an alkyl group of 1 to 8 carbon atoms,
$R^1$ is an alkylene group having 1 to 8 carbon atoms,
Z is $R^1COOH$ or $R^1H$, and
n is an integer having a value of 1 or 2.

In the presence of the above-mentioned radiation, the photosensitizer compound causes decomposition of known free radical initiators such as iodonium salts, biimidazoles, trialkylphosphites, alkyl peroxides, benzyl halides, alkyl nitrates, and benzophenones into free radicals that initiate polymerization in ethylenically-unsaturated materials such as those containing acrylates, methacrylates, acrylamides, methacrylamides, and allyl and vinyl monomers.

The MKA can be converted to a salt of the present invention by the neutralization of the acid form compound of Formula I using inorganic bases such as metal hydroxides (e.g., NaOH), or organic bases such as amines (e.g., triethylamine or hydroxyethylamine). The salt has the formula

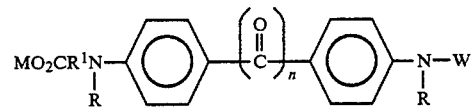

II wherein
R, $R^1$, and n are as defined above, and
M is a cation (e.g., an alkali or alkaline earth metal ion or a substituted alkyl ammonium ion such as a trialkylammonium ion or hydroxyalkylammonium ion), and
W is $R^1COOM$ or $R^1H$.

The invention provides a photoinitiator system for a photopolymerizable composition having favorable solubility characteristics in water as well as efficient curing of the coated film upon exposure. Such a system, using a MKA salt, permits the use of the desirable iodonium salt technology in water-based coatings.

MKA, in addition to being water-soluble in the basic form (i.e., the salt form), is organic-solvent-soluble in the acid form. For example, the acid form is soluble in pyridine, dimethylsulfoxide, dimethylformamide, methanol, and other polar organic solvents.

DETAILED DESCRIPTION

As used herein, a "photoinitiator system" comprises at least two components which interact on exposure to activating radiation to initiate the addition polymerization of simple unsaturated compounds or vinyl monomers. One component of the photoinitiator system, hereinafter referred to as the "sensitizer", is light-sensitive and is thought to be raised to an excited energy state on absorption of activating radiation and its energy is transferred to another compound. The other component, hereinafter referred to as the "initiator" or "free radical initiator", is thought to interact with an excited sensitizer to generate free radicals. It is well known, of course, that addition polymerization can be initiated by free radicals.

The sensitizer component of the photoinitiator system of this invention is the salt of a Michler's ketone analog, the MKA being selected from the class of compounds of the general formula I, above, wherein R is an alkyl group of 1 to 8 carbon atoms, preferably 1 to 4 carbon atoms, and most preferably it is methyl, $R^1$ is an alkylene group having 1 to 8 carbon atoms and preferably it is a —$CH_2CH_2$— group, and Z is $R^1COOH$ or $R^1H$, and preferably Z is a —$(CH_2)_2COOH$ group, and n is an integer having a value of 1 or 2.

The preferred sensitizer is the sodium salt of

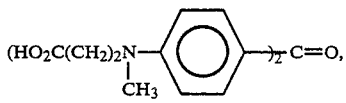

4,4'-bis(N-2-carboxyethyl-N-methylamino)benzophenone.

The MKA's of the present invention, wherein n is equal to 1, are all prepared by reaction of equivalent amounts of the appropriate substituted aniline compound and methyl acrylate at a temperature of 110° C. for 72 hours in the presence of a catalytic amount of acetic acid (see Equation I of the flow chart below). Alternatively, when n is equal to 1, the MKA's of the present invention may be prepared by reaction of the appropriate substituted aniline and ω-substituted alkylester (see Equation IA of the flow chart below). In either case, the reaction product is purified by distillation or crystallization, and one equivalent is condensed with 2 equivalents of formaldehyde by heating at 80° C. for 17 hours in the presence of acid, such as HCl, and a low molecular weight alcohol (having the same alkyl group as the acrylate or ω-substituted alkylester), to give the bis compound reaction product (see Equation II of the flow chart below). Oxidation of one equivalent of the bis reaction product of Equation II with 2 equivalents of 2,3-dichloro-5,6-dicyano-1,4-benzoquinone (DDQ), available from Aldrich Chemical Co., is accomplished by heating to reflux for 1 hour to give a keto diester as shown in Equation III of the flow chart. Liberation of the carboxyl group is accomplished by basic hydrolysis (reflux) of the keto diester for 1 hour in the presence of sodium hydroxide and methanol, followed by neutralization of the product with dilute sulfuric acid according to Equation IV of the flow chart to obtain the free acid in crystalline form. Purification can be accomplished by recrystallization from ethanol. In this preparation, an equivalent amount of chloranil (2,3,5,6-tetrachloro-1,4-benzoquinone) can be substituted for DDQ.

FLOW CHART

In the formulas below R is an alkyl group of 1 to 8 carbon atoms; X is a leaving group, such as iodine, bromine, chlorine, alkylsulfonates such as methanesulfonate and p-toluenesulfonate, and diazonium ions, and preferably it is bromine; $R^2$ is methyl or ethyl; and p is an integer of 1 to 8.

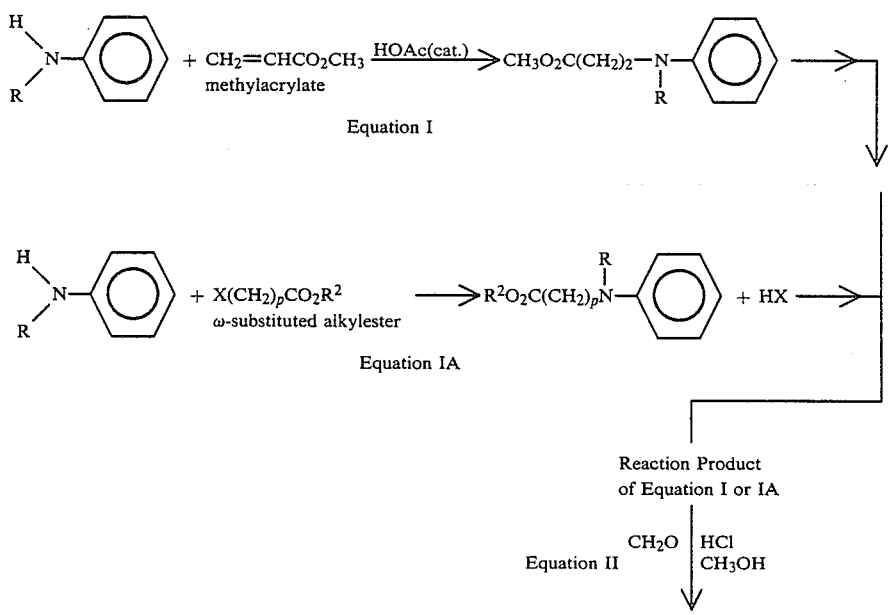

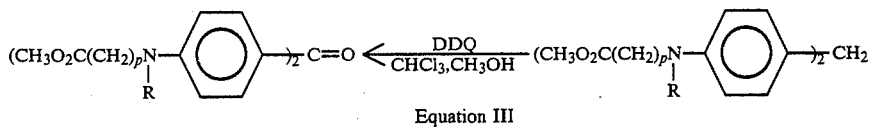

Equation III

Equation IV
1. NaOH, CH₃OH
2. H₂SO₄, H₂O

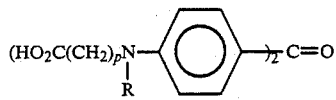

MKA

Other useful compounds, prepared according to the flow chart above, are listed below. The starting material used, if other than N-methylaniline or methyl acrylate, is noted in parentheses.

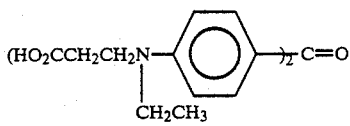

4,4′-bis(N-2-carboxyethyl-N-ethylamino)benzophenone (N-ethylaniline, Aldrich Chemical Co.)

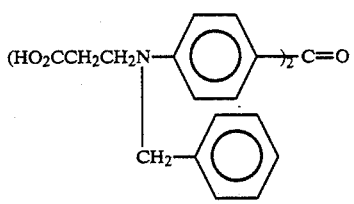

4,4′-bis(N-2-carboxyethyl-N-benzylamino)benzophenone (N-benzylaniline, Aldrich Chemical Co.)

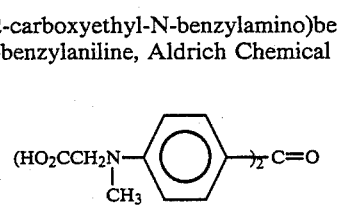

4,4′-bis(N-carboxymethyl-N-methylamino)benzophenone (ethyl bromoacetate, Aldrich Chemical Co.)

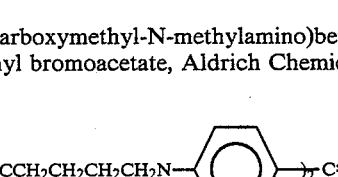

4,4′-bis(N-4-carboxybutyl-N-methylamino)benzophenone (5-bromovaleric acid, Aldrich Chemical Co.)

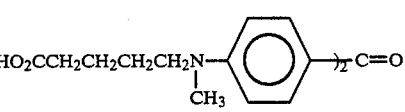

4,4′-bis(N-3-carboxypropyl-N-methylamino)benzophenone [4-bromobutyronitrile (converted to the corresponding acid by means known in the art), Aldrich Chemical Co.]

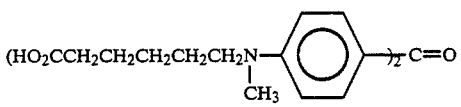

4,4′-bis(N-5-carboxypentyl-N-methylamino)benzophenone (ester of 6-bromohexanoic acid, Aldrich Chemical Co.)

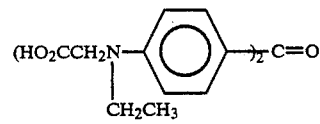

4,4′-bis(N-carboxymethyl-N-ethylamino)benzophenone (ethyl bromoacetate, Aldrich Chemical Co.; also substitute N-ethylaniline for N-methylaniline)

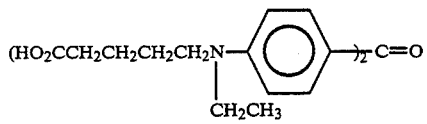

4,4′-bis(N-4-carboxybutyl-N-ethylamino)benzophenone (ester of 5-bromovaleric acid, Aldrich Chemical Co.; also substitute N-ethylaniline for N-methylaniline)

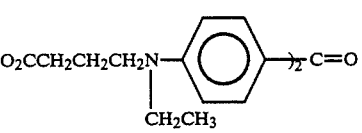

4,4′-bis(N-3-carboxypropyl-N-ethylamino)benzophenone (4-bromobutyronitrile, Aldrich Chemical Co.; also substitute N-ethylaniline for N-methylaniline)

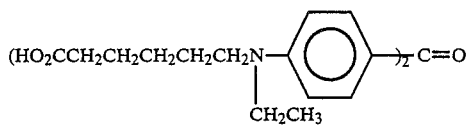

4,4'-bis(N-5-carboxypentyl-N-ethylamino)benzophenone (ester of 6-bromohexanoic acid, Aldrich Chemical Co.; also substitute N-ethylaniline for N-methylaniline)

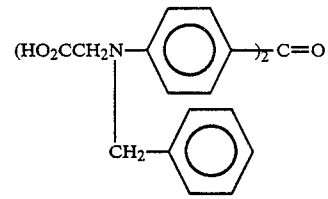

4,4'-bis(N-carboxymethyl-N-benzylamino)benzophenone (ethyl bromoacetate, Aldrich Chemical Co.; also substitute N-benzylaniline for N-methylaniline)

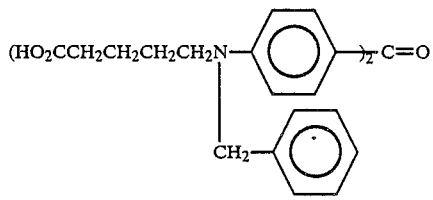

4,4'-bis(N-4-carboxybutyl-N-benzylamino)benzophenone (ester of 5-bromovaleric acid, Aldrich Chemical Co.; also substitute N-benzylaniline for N-methylaniline)

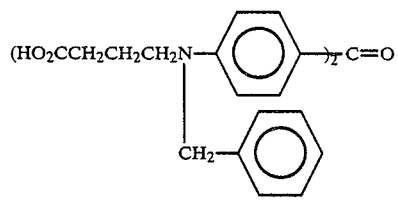

4,4'-bis(N-3-carboxypropyl-N-benzlamino)benzophenone (4-bromobutyronitrile, Aldrich Chemical Co.; also substitute N-benzylaniline for N-methylaniline)

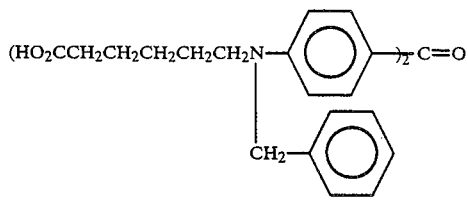

4,4'-bis(N-5-carboxypentyl-N-benzylamino)benzophenone (ester of 6-bromohexanoic acid, Aldrich Chemical Co.; also substitute N-benzylaniline for N-methylaniline)

Starting materials N-methylaniline and methyl acrylate are used in preparing the preferred MKA

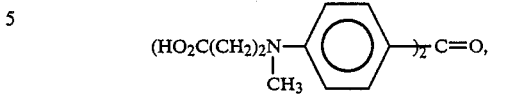

4,4'-bis(N-2-carboxyethyl-N-methylamino)benzophenone.

Preparation of all MKA's wherein n of formula I is 2 can be made according to the method described in Example 3 below. The preferred substituted benzil of the present invention is the MKA compound:

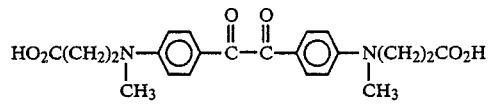

4,4'-bis(N-2-carboxyethyl-N-methylamino)benzil.

The sensitizers of the present invention are used with known free radical initiators such as iodonium salts, biimazoles, trialkylphosphites, alkyl peroxides, benzyl halides, alkyl nitrates, and benzophenones, to form a photoinitiator system. The preferred class of initiators comprises iodonium salts, most preferably diphenyliodonium hexafluorophosphate. The photoinitiator system comprises 0.1 to 10 percent by weight, preferably 0.5 to 5 percent, and most preferably 0.8 to 4 percent, of each component (i.e., sensitizer and initiator) of the total solids in the photopolymerizable composition.

The photoinitiator system described above induces the polymerization of a wide variety of ethylenically-unsaturated compounds when exposed to radiation within the range of from 320 to 420 nm with an efficiency that is as great as that provided by Michler's ketone water-insoluble systems.

Any addition polymerizable compound containing ethylenic unsaturation can be photopolymerized using the photoinitiator system of this invention. Preferred are simple compounds (i.e., monomers) containing ethylenic unsaturation, as well as oligomers and polymers containing end groups or pendant groups terminating with ethylenic unsaturation. Other examples of useful addition polymerizable compounds containing ethylenic unsaturation include monomeric acrylates, acrylamides, methacrylates, methacrylamides, allyl compounds, vinyl ethers, vinyl esters, N-vinyl compounds, styrenes, acrylonitriles and crotonates.

MKA's and their salts of the present invention can be used to polymerize water-soluble and water-insoluble monomers. Examples of addition polymerizable compounds that are not water-soluble but can be used with the MKA's of the present invention include acrylate and methacrylate compounds, including alkyl acrylates containing from 1 to 10 and most preferably 1 to 5 carbon atoms in the alkyl portion, such as methyl acrylate and ethyl methacrylate; pentaerythritol tri- and tetraacrylates and methacrylates; esters of polyols including glycol diacrylates and dimethacrylates, such as tripropylene glycol diacrylates, tetraethylene glycol diacrylate and triethylene glycol dimethacrylate; alkanediol diacrylates such as hexanediol diacrylates; and polyether diacrylates. Examples of water-soluble polymerizable compounds that can be used with the salts of the MKA's disclosed herein are acrylamides and methacrylamides such as N-methylolacrylamide, methylene bisacrylamide, diacrylamidomethylether, and diacetone acrylamide; acids such as acrylic acid and methacrylic acid; and monomers with water-solubilizing groups such as sulfonated monomers (e.g., 3-sulfo-2-hydroxypropylmethacrylate).

The water-soluble photoinitiator system of the present invention is useful in water-developable imaging technology, such as in lithographic plate construction, in proofing materials, and in radiation-cured coatings and inks. A water-soluble Michler's ketone analog salt of the present invention, when mixed with a novel ethylenically-unsaturated dextrin oligomer (disclosed in assignee's copending patent application, Ser. No. 471,781, filed Mar. 3, 1983, now U.S. Pat. No. 4,451,613, an initiator, and at least one ethylenically-unsaturated monomer provide a hydrophilic top coat (disclosed in assignee's copending patent application, Ser. No. 471,828, filed Mar. 3, 1983 for positive-acting water-developable lithographic printing plates (disclosed in assignee's copending patent application Ser. No. 471,808, filed Mar. 3, 1983. The oligomer photopolymerizes to a hydrophilic, water-insoluble polymer which provides the background of the imaged plate.

Objects and advantages of this invention are further illustrated by the following examples, but the particular materials and amounts thereof recited in these examples, as well as other conditions and details, should not be construed to unduly limit this invention.

EXAMPLE 1

N-methylaniline (375.2 g, 3.5 moles) was condensed with methyl acrylate (301.4 g, 3.5 moles) in the presence of 35 ml of glacial acetic acid, by heating to 110° C. for 72 hours. The resulting product was isolated by distillation. Spectral and chromatographic analyses indicated the presence of the desired product having the formula

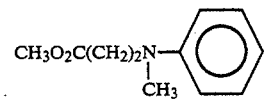

200.0 g (1.03 moles) of the product obtained above was condensed with 84.0 g (1.0 mole, 2.0 eq.) of 37 percent aqueous formaldehyde in the presence of 13.5 g of concentrated hydrochloric acid and 600 ml of methanol. The mixture was refluxed for 18.5 hours. The reaction product was extracted, washed, and dried. Spectral and chromatographic analyses indicated the presence of the bis compound reaction product having the formula

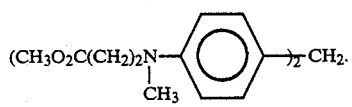

A solution of 8.80 g (0.022 moles) of the bis compound reaction product in 20 ml of methanol and 5 ml of chloroform was stirred for 15 mintes and then DDQ (10.0 gm; 0.044 moles) was added over a 5-minute period. The reaction mixture was stirred for 5 minutes at room temperature and for 1 hour at reflux. The keto diester reaction product was extracted, washed, dried, chromatographed, and then identified by spectral analysis as the compound

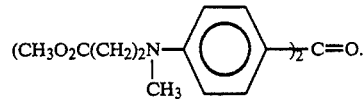

3.51 g (8.51 mmol) of the keto diester in 125 ml of 10 percent sodium hydroxide/methanol was refluxed for 1 hour and was completely converted to the keto diacid. The keto diacid was acidified with aqueous sulfuric acid and the crystals produced were purified by recrystallization from ethanol and identified by spectral, chromatographic and combustion analyses as the desired MKA having the formula

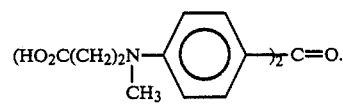

EXAMPLE 2

A mixture containing 26.4 g of 4,4'-bis(N-2-carbomethoxyethyl-N-methylamino)diphenylmethane and 32.4 g of Chloranil in 175 g of methanol containing 2 g of water was heated to reflux for 17 hours. The solvent was removed and the residue taken up in 200 ml of methylene chloride. This was washed with 200 ml of 20 percent potassium hydroxide, 100 ml of water, and 100 ml of two percent hydrochloric acid. To the organic layer was added 10 g of anhydrous magnesium sulfate, and the suspension stirred for 15 minutes. Silica gel (25 g) was then added and the mixture stirred for 30 minutes, then filtered. The methylene chloride was removed and the residue refluxed in a solution of 25 g of potassium hydroxide in 150 ml of water for three hours. The solution was cooled and extracted wtih 50 ml of methylene chloride. The pH of the aqueous solution was adjusted to 4.0 with dilute hydrochloric acid and the resultant precipitate filtered. The residue was washed with water and dried to give 12 g of 4,4'-bis-(N-2-carboxyethyl-N-methylamino)benzophenone.

EXAMPLE 3

4,4'-bis(N-2-carbomethoxyethyl-N-methylamino)-benzil was prepared according to the procedure of Tuzun, et al. (Org. Syn., 41, 1 (1961)). Charges were 86.4 g of N-2-carbomethoxyethyl-N-methylaniline (prepared according to the procedure in Example 1), 41.7 g of anhydrous aluminum chloride and 6.7 ml of oxalyl chloride. After the addition of 157 ml of water the reaction mixture was extracted three times with 100 ml portions of chloroform. The chloroform extract was washed with water, dried over anhydrous sodium sulfate and filtered. The solvent was removed on a steam bath and the dark brown residue was chromatographed on Activity I basic alumina (the most active and dried form, in terms of adsorbing power, of chromatographic grade alumina) using a 1:1 mixture of ethyl acetate and heptane. Fractions containing a new product which appeared to be free of starting material by TLC (thin layer chromatography) were combined and concentrated to a brown gum. The combined chromatography fractions were dissolved in 50 ml of 10 percent methanolic sodium hydroxide and refluxed overnight. A tan solid separated which was isolated by filtration, washed with methanol and dried. This material in water had λmax=382 nm and εmax=14,650. This is only one third the extinction coefficient reported for 4,4'-bis(-dimethylamino)benzil. No further purification was attempted.

EXAMPLE 4

Two solutions were prepared with the following composition:

| Component | Weight, grams |
| --- | --- |
| pentaerythritol tetraacrylate | 1.48 |
| polymethacrylated urethane oligomer (preparation II in U.S. Pat. No. 4,228,232) (49 percent) | 1.58 |
| Formvar ® 12/85 (9.75 percent) [poly(vinyl formal), prepared from a polyvinyl acetate starting material and having 85 percent of the acetate groups replaced by alcohol and formal groups (the polyvinyl acetate having a viscosity of about 12 cp at 25° C., as 86 grams in 1000 ml of benzene)] polymer (preparation V in U.S. Pat. No. 4,228,232) (15.8 percent) | 5.3 |
| | 1.37 |
| triethylamine | 0.07 |
| n-propanol/water azeotrope | 30.1 |
| diphenyliodonium hexafluorophosphate | 0.015 |

In one of the above solutions was dissolved 0.0075 g of Michler's ketone to give solution A. In the other solution 0.0075 g of the product from Example 1 was dissolved to give solution B. These two solutions were coated on grained, anodized aluminum with a #8 wire-wound rod and dried for two minutes at 66° C. The dry coatings were exposed through a 21-step sensitivity guide for 10 seconds under the glass in a Berkey Ascor ® Vacuum Printer (no vacuum) with a 5 kw Berkey Addalux ® mercury metal halide light (BTC Berkey Technical Co., Woodside, NY) source and then wiped with an aqueous solution of 3 percent n-propanol, 3 percent sodium metasilicate and 0.06 percent Dowfax ® 2A-1 (surfactant comprising 45 percent solution of sodium dodecyl diphenylether disulfonate, Dow Chemical Co.). Ten steps of photopolymer were visible on the coating from solution A and 9–10 steps on the coating from solution B proving that the product from Example 1 is as efficient a sensitizer for the iodonium salt as Michler's ketone.

EXAMPLE 5

Slurry-brush-grained aluminum was coated using a #3 wire-wound rod with the following slurry which had been milled for three days in a 100 cc jar with glass marbles:

| | |
| --- | --- |
| ethylenically unsaturated urethane oligomer+, | 9.2 g |
| diphenyliodonium hexafluorophosphate | 0.4 g |
| Michler's ketone | 0.4 g |
| 5 percent gamma-methacryloxypropyltrimethoxysilane [(CH$_2$=C(CH$_3$)CO$_2$(CH$_2$)$_3$Si(OCH$_3$)$_3$, Dow Corning Corp.] treated 8 μquartz | 10 g |
| 1,1,2-trichloroethylene | 10 g |
| methyl ethyl ketone | 10 g |

$$\begin{array}{c}
\text{[ethylenically unsaturated urethane oligomer structure]}
\end{array}$$

Prepared as follows:

Into a reaction flask equipped with an agitator, liquid addition funnel, thermometer, and inlet tube for the introduction of a dry nitrogen atmosphere was placed 600 g (0.6 mole) of "Lexorez" 5171-280, 1.5 g dibutyltin dilaurate, and 2.1 g Irganox ® 1010 antioxidant ((tetrakis)-3-(3,5-di(t-butyl)-4-hydroxyphenyl) propionyloxymethyl)methane, commercially available from Ciba-Geigy Inc.). The resulting mixture was agitated and 465 g (3.0 moles) of 2-isocyanatoethyl methacrylate was added to the reaction flask over a 30 minute period, with the rate of addition of the 2-isocyanatoethyl methacrylate being adjusted to keep the temperature of the reaction mixture from exceeding about 75° C. A heating mantle was placed around the reaction flask, and the reaction mixture was heated for an additional 30 minutes at a temperature of about 70° to 75° C., until infrared spectroscopic analysis of the reaction mixture indicated that the isocyanate groups had been consumed. The reaction product, which was the desired oligomer, was allowed to cool.

The coating was dried for one minute at 66° C. and irradiated for 40 seconds at 19.3 cm from a 5 kw Berkey Addalux ® mercury metal halide light source. The resulting dry coating had a surface roughness AA (arithmetic average) of 23 microinches (0.88 micrometers) as measured with a Surfanalyzer ® 150 (Gould, Inc.).

The stock dispersion below was prepared by milling the following components for four days using glass marbles on a roller mill.

| | |
| --- | --- |
| acrylamidomethyldextrin++ | 12 g |
| water | 108 g |
| 1,3-diacrylamido-2-hydroxypropane | 5.2 g |
| 2,3-dihydroxy-1-acrylamidopropane (31 percent) | 8.4 g |
| octylphenoxy polyethoxyethanol, Triton ® X-100 (10 percent), (Rome and Haas Co.) | 0.8 g |

| | |
|---|---|
| silica gel, Syloid 244 (W. R. Grace Co.) | 7.8 g |

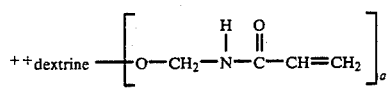

(wherein "a" is equal to 0.32, "a" being the degree of substitution ("d.s.") which means the fraction of anhydroglucose units reacted with N—methylolacrylamide), was prepared as follows:

To a 95.6 liter (25 gallon) glass-lined kettle 35 fitted with an anchor agitator, an overhead condenser suitable for distillation, a temperature control, and an inert air sweep was added 11.1 kg (24.6 lb.) of N—methylol-acrylamide in 12.1 kg (26.7 lb.) of water, 0.72 kg (1.6 lb.) of acrylic acid, 7.5 g of phenothiazine, and 6.3 kg (14.0 lb.) of deionized water. To this 20.7 kg (46 lb.) of the corn-based dextrin, Stadex ® 140 (A. E. Staley Mfg. Co., Decatur, IL), was added with agitation. The mixture was agitated until uniform and then heated to 91° C. (195° F.) with an inert air sweep. When 8.9 kg (19.8 lb.) of water was distilled and collected, the batch was cooled to 27° C. (80° F.) and 23.4 kg (52 lb.) of deionized water was added. The cool solution was filtered and added over a 15 minute period to 375 kg (833 lb.) of methanol in 568 liter (150 gal.) glass-lined kettle with agitation. The product was vacuum-filtered and dried in trays at 38° C. (100° F.) for several days to give 33.8 kg (75 lb.) of a chunky solid. The product contained 32 percent incorporated N—methylolacrylamide.

Four dispersions (A, B, C, and D), with the compositions below, were made from the above stock dispersion.

| Dispersion | Stock dispersion | I$^a$ | Colanyl red pigment (50 percent) | Sodium salt of product from Example 2 2 percent |
|---|---|---|---|---|
| A | 35 g | 0.1 g | 0.9 g | — |
| B | 35 g | 0.1 g | — | 7.7 g |
| C | 35 g | 0.1 g | 0.9 g | 7.7 g |
| D | 35 g | 0.1 g | — | — |

$^a$diphenyliodonium hexafluorophosphate

After milling an additional one hour the dispersions were coated on the above described subcoated aluminum using a wire-wound rod. After drying for two minutes at 66° C. the coating weight was determined to be 3.44 g/m$^2$. The four different coatings were exposed, developed with water and hand-inked with the following observations:

| Dispersion | Exposure$^b$ | Percent coating weight loss on development | Inking results |
|---|---|---|---|
| A | 15 sec, high intensity | 11.3 | Red-pigmented top coat retained to a ghost step* 5, but ink-water differential poor from step 6 to step 11. |
| B | 1.7 sec, low intensity | 1.5 | Inked to an open step** 5, ghost step 7 with sharp ink water differential at step 8. |
| C | 3.5 sec, low intensity | 5.3 | Red pigmented solid step 5, ghost 6, inked to step 7 with sharp ink-water differential at step 7 |
| D | 8 sec, low intensity | 31 | Inked to an open step 6 but ink-water differential poor from step 7 to step 12. |

$^b$Plate in contact with a 21-step sensitivity guide in Berkey-Ascor Vacuum Printer with 5 kw diazo bulb.
*ghost step - first step (lowest exposure step) where an image is visibly discernible from the background
**open step - step completely free of ink These results clearly illustrate the effect of the MKA salt. Adding this compound to the top layer increases the rate of photocuring of the bulk of this layer relative to the rate of curing at the interface between the top and bottom layer. It also increases the extent of polymerization in this layer causing more complete insolubilization in water. These results show that adding the MKA salt causes a dramatic increase in the photographic contrast of the imaging system and a decrease in the coating weight loss in the water development step. These properties provide a lithographic printing plate with increased image quality and durability which translates to increased press life. These advantageous properties were demonstrated by running the plates on a Miehle sheet-fed press using conditions which greatly accelerate plate wear. The results of the test are summarized in the following table:

| Dispersion | Exposure, seconds | Printed gray scale s/g$^c$ | Halation | Start of plate wear$^d$, relative |
|---|---|---|---|---|
| A | 15 HI$^e$ | 8+/13+ | very bad | 3.0 |
| B | 1.7 LI$^f$ | 5/7 | slight | 2.0 |
| C | 3.5 LI | 4/6 | slight | 1.0 |
| D | 8 LI | 6+/11 | very bad | 2.5 |

$^c$solid step/ghost step
$^d$wear appears in the hydrophilic background of the plate which begins to take ink
$^e$high intensity
$^f$low intensity Dispersions B and C having a MKA photosensitizer in the topcoat show good contrast and good image resolution combined with satisfactory press life. Dispersions A and D not having a photosensitizer in the topcoat display poor contrast and poor image resolution.

EXAMPLE 6

Four solutions were prepared by combining the given amounts of the following components:

| Component | Weight, grams Solution | | | |
|---|---|---|---|---|
| | A | B | C | D |
| acrylamidomethyldextrin, prepared as in Example 5, above | 3.96 | 3.96 | 3.96 | 3.96 |
| N—methylolacrylamide (48 percent) | 3.75 | 3.75 | 3.75 | 3.75 |
| diphenyliodonium hexafluorophosphate | 0.18 | 0.18 | 0.18 | 0.18 |
| water | 23.3 | 23.3 | 23.3 | 23.3 |
| octylphenoxy polyethoxyethanol, Triton ® X-100, (10 percent) | 0.3 | 0.3 | 0.3 | 0.3 |
| colanyl red pigment | — | 0.63 | — | 0.63 |
| 4,4'-bis-(N—2-carboxyethyl-N—methylamino)benzil, | — | — | 0.18 | 0.18 |

-continued

| Component | Weight, grams Solution | | | |
|---|---|---|---|---|
| | A | B | C | D |
| see Example 3 | | | | |

Plates were prepared by first subcoating chemically grained and anodized aluminum with a solution with the following composition,

| Component | Weight, grams |
|---|---|
| pentaerythritol tetraacrylate | 155.2 |
| polymethacrylated urethane oligomer (preparation II in U.S. Pat. No. 4,228,232) (49.2 percent) | 173.3 |
| Formvar ® 12/85 (9.84 percent) | 551.0 |
| polymer (preparation V in U.S. Pat. No. 4,228,232) (15.8 percent) | 146.3 |
| triethylamine | 7.75 |
| n-propanol/water azeotrope | 1850 |
| diphenyliodonium hexafluorophosphate | 15.7 |
| Michler's ketone | 7.85 | drying for two minutes at 66° C., curing this coating for four seconds at 20.3 cm from a 5 kw mercury metal halide bulb, overcoating with dispersions A, B, C and D and drying for two minutes at 66° C. These plates were exposed through lithographic film with half-tone screens of varying density and developed by wiping with water. The developed plates were mounted on a Miehle sheet-fed press. The results of the press run were as follows.

| Plate from dispersion | Roll-up | 15,000 Impressions |
|---|---|---|
| A | Severe blinding due to halation-only the darkest shadows printed | Severe wear in background on all screens |
| B | Excellent ink density on all screens | Severe wear in background on all screens |
| C | Very good ink density on all screens | Wear in background only in darkest shadows |
| D | Excellent ink density on all screens | Wear in background only in darkest shadows |

By acting as a UV absorber and photosensitizer in the top layer, the 4,4'-bis(N-2-carboxyethyl-N-methylamino)benzil causes improved resolution and increased durability of the hydrophilic photopolymer background.

Various modifications and alterations of this invention will become apparent to those skilled in the art without departing from the scope and spirit of this invention, and it should be understood that this invention is not to be unduly limited to the illustrative embodiments set forth herein.

I claim:

1. A compound having the general formula

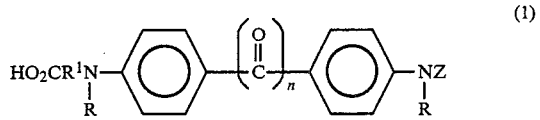

or

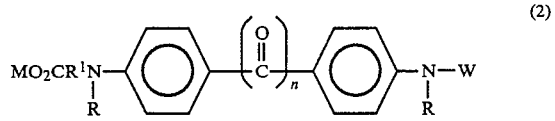

wherein
R is an alkyl group of 1 to 8 carbon atoms,
$R^1$ is an alkylene group having 1 to 8 carbon atoms,
Z is $R^1COOH$ or $R^1H$,
n is an integer having a value of 1 or 2,
M is a water-solubilizing cation, and
W is $R^1COOM$ or $R^1H$.

2. The compound according to claim 1 having the formula

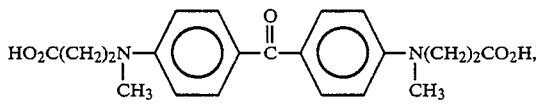

or salt thereof.

3. The compound according to claim 1 having the formula

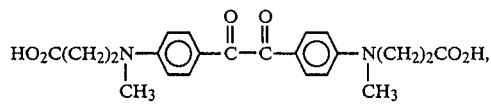

or salt thereof.

4. The compound according to claim 1 wherein M is selected from the group consisting of an alkali metal ion, an alkaline earth metal ion, and a substituted alkyl ammonium ion.

5. The compound according to claim 1 wherein R is an alkyl group having 1 to 4 carbon atoms.

6. The compound according to claim 1 wherein said compound has the formula

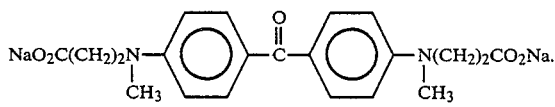

* * * * *